United States Patent
Propp et al.

(10) Patent No.: US 10,057,102 B1
(45) Date of Patent: Aug. 21, 2018

(54) MODULATION SYSTEM

(71) Applicant: Adaptive Networks, Inc., Needham, MA (US)

(72) Inventors: Michael B. Propp, Brookline, MA (US); Khaled Saab, Thornhill (CA); David L. Propp, Thornhill (CA)

(73) Assignee: Adaptive Networks, Inc., Needham, MA (US)

( * ) Notice: Subject to any disclaimer, the term of this patent is extended or adjusted under 35 U.S.C. 154(b) by 0 days.

(21) Appl. No.: 14/875,641

(22) Filed: Oct. 5, 2015

Related U.S. Application Data

(60) Provisional application No. 62/059,593, filed on Oct. 3, 2014.

(51) Int. Cl.
*H04L 27/34* (2006.01)
*H04L 1/00* (2006.01)
*H04L 27/36* (2006.01)

(52) U.S. Cl.
CPC ........ *H04L 27/3405* (2013.01); *H04L 1/0003* (2013.01); *H04L 27/362* (2013.01)

(58) Field of Classification Search
CPC .. H04L 1/0003; H04L 27/3408; H04L 27/362
USPC .......................................................... 375/298
See application file for complete search history.

(56) References Cited

U.S. PATENT DOCUMENTS

| | | | | |
|---|---|---|---|---|
| 5,528,661 | A * | 6/1996 | Siu ........................ | H04M 3/30 379/1.01 |
| 2003/0002495 | A1* | 1/2003 | Shahar .................. | H04L 1/0003 370/389 |
| 2006/0046709 | A1* | 3/2006 | Krumm .............. | H04N 21/4126 455/422.1 |
| 2008/0002789 | A1* | 1/2008 | Jao ....................... | H04B 7/0882 375/316 |
| 2011/0274148 | A1* | 11/2011 | Urban .................. | H04L 1/0002 375/222 |

* cited by examiner

*Primary Examiner* — Michael Neff
(74) *Attorney, Agent, or Firm* — Sean D. Detweiler, Esq.; Morse, Barnes-Brown & Pendleton, P.C.

(57) ABSTRACT

A modulation system is configured to employ a dynamically reconfigurable M-ary modulation scheme.

28 Claims, 13 Drawing Sheets

MODULATION SYSTEM

CROSS-REFERENCE TO RELATED APPLICATIONS

This claims priority to U.S. Application No. 62/059,593, filed Oct. 3, 2014 and entitled "A MODULATION SYSTEM." This application is incorporated by reference in its entirety.

BACKGROUND

Communications devices desire to maintain greater data rates. Maintaining greater data rates may be problematic as noise can interrupt and/or degrade performance.

DETAILED DESCRIPTION

Figure 1:
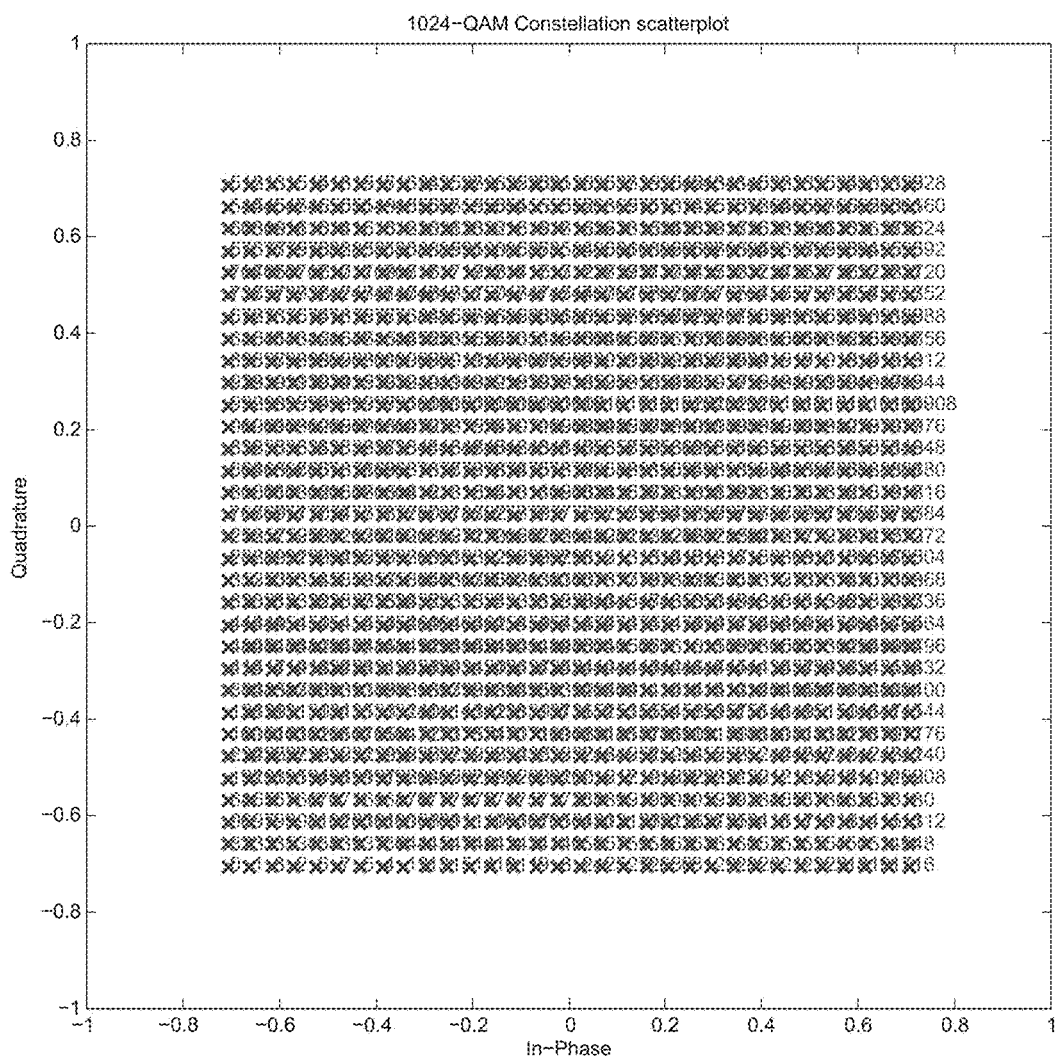
FIGS. 1-10 represent symbol representation based on the in-phase value and the quadrature value.
Figure 2:
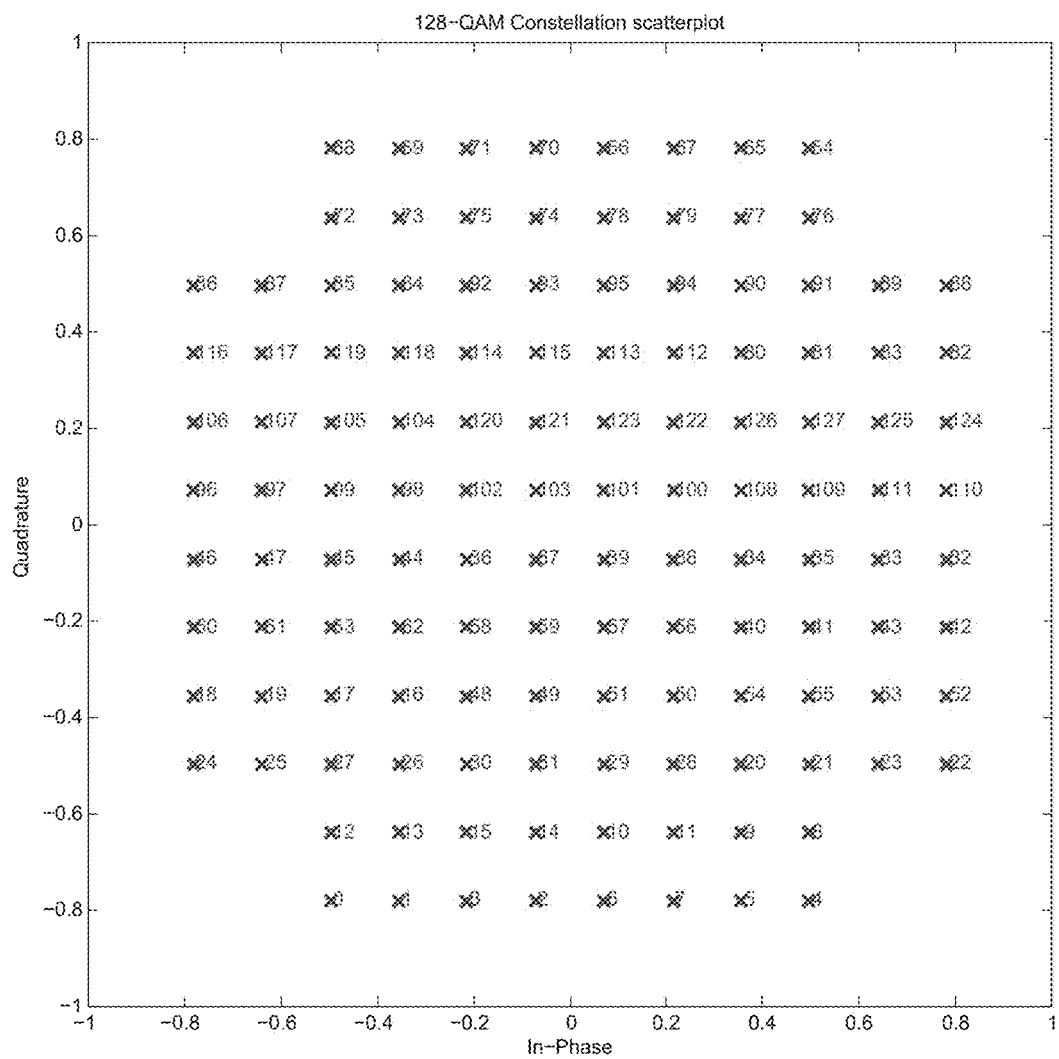
Figure 3:
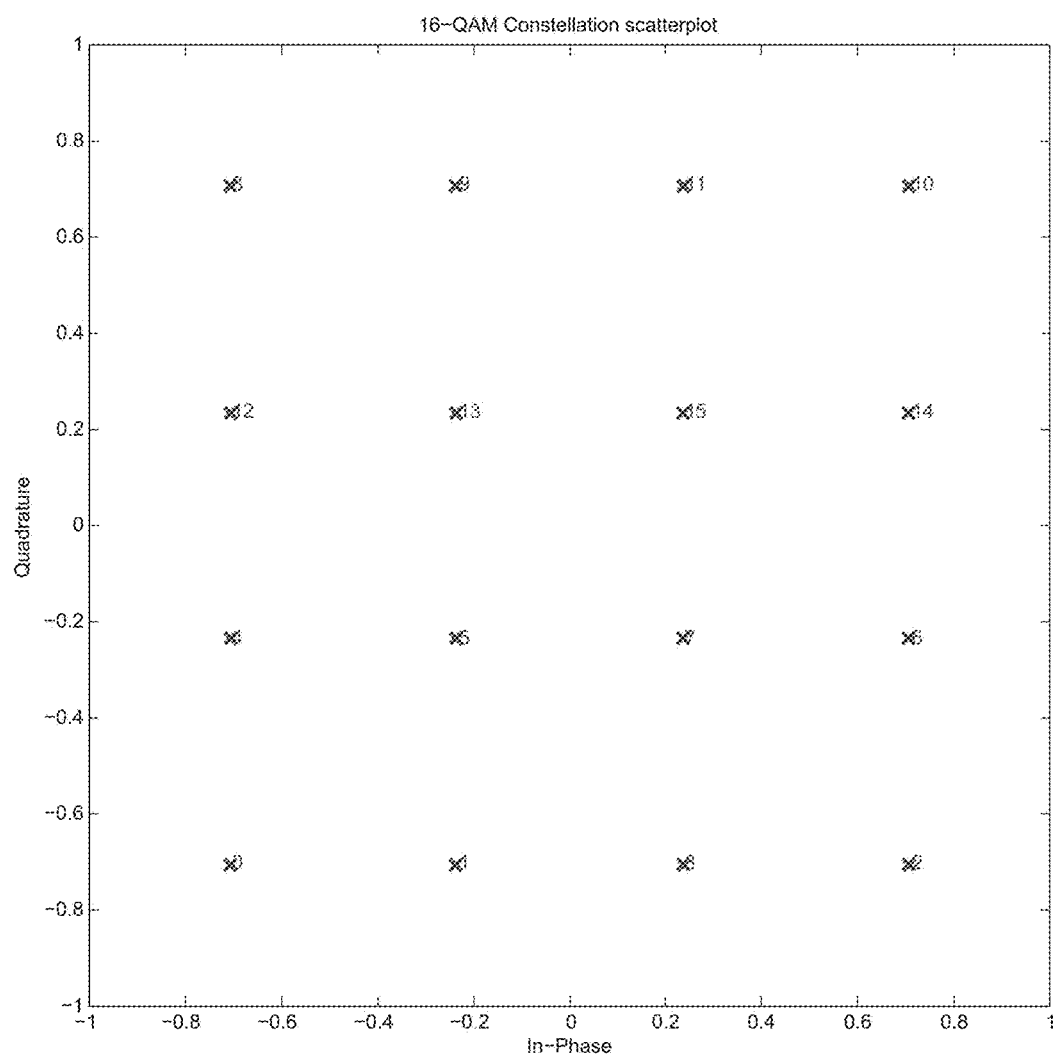
Figure 4:
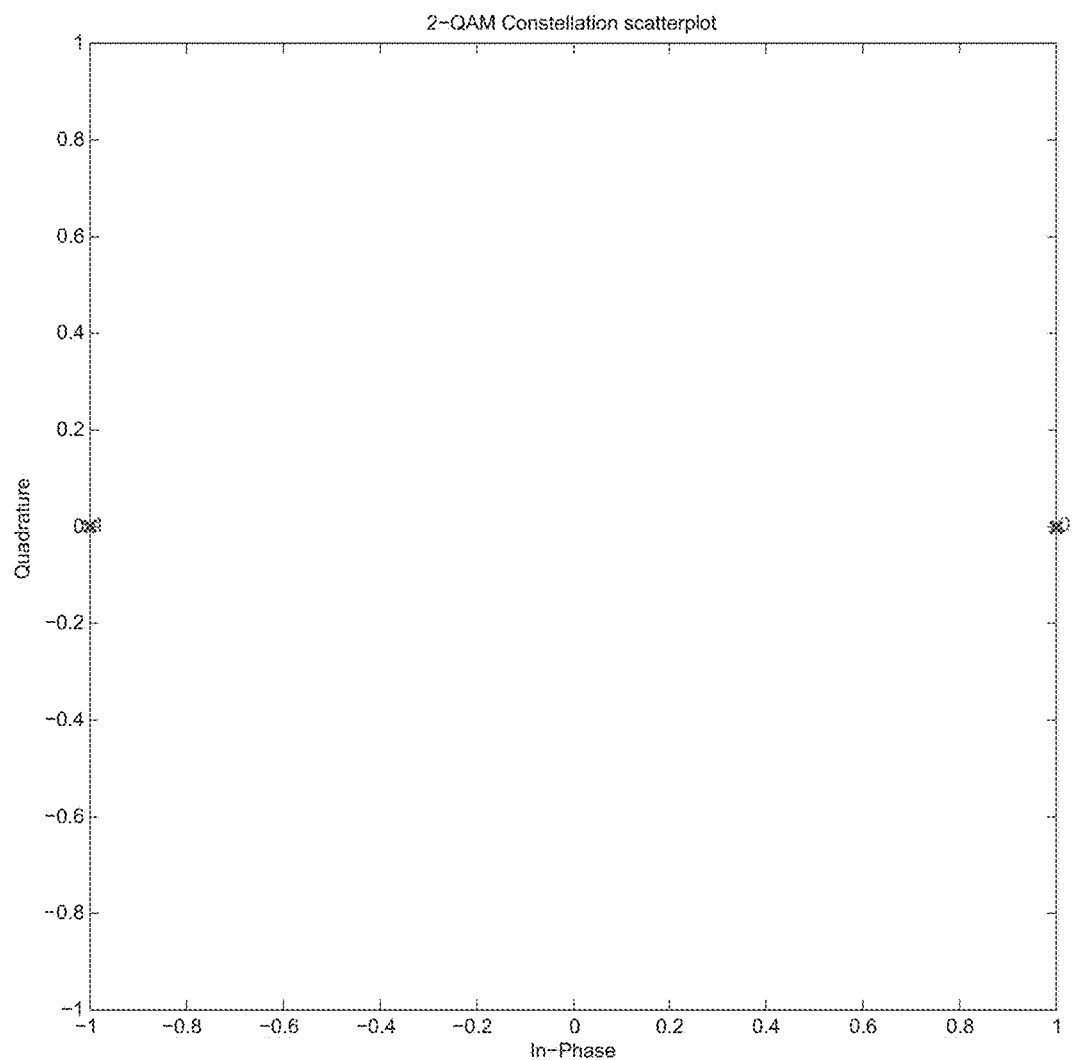
Figure 5:
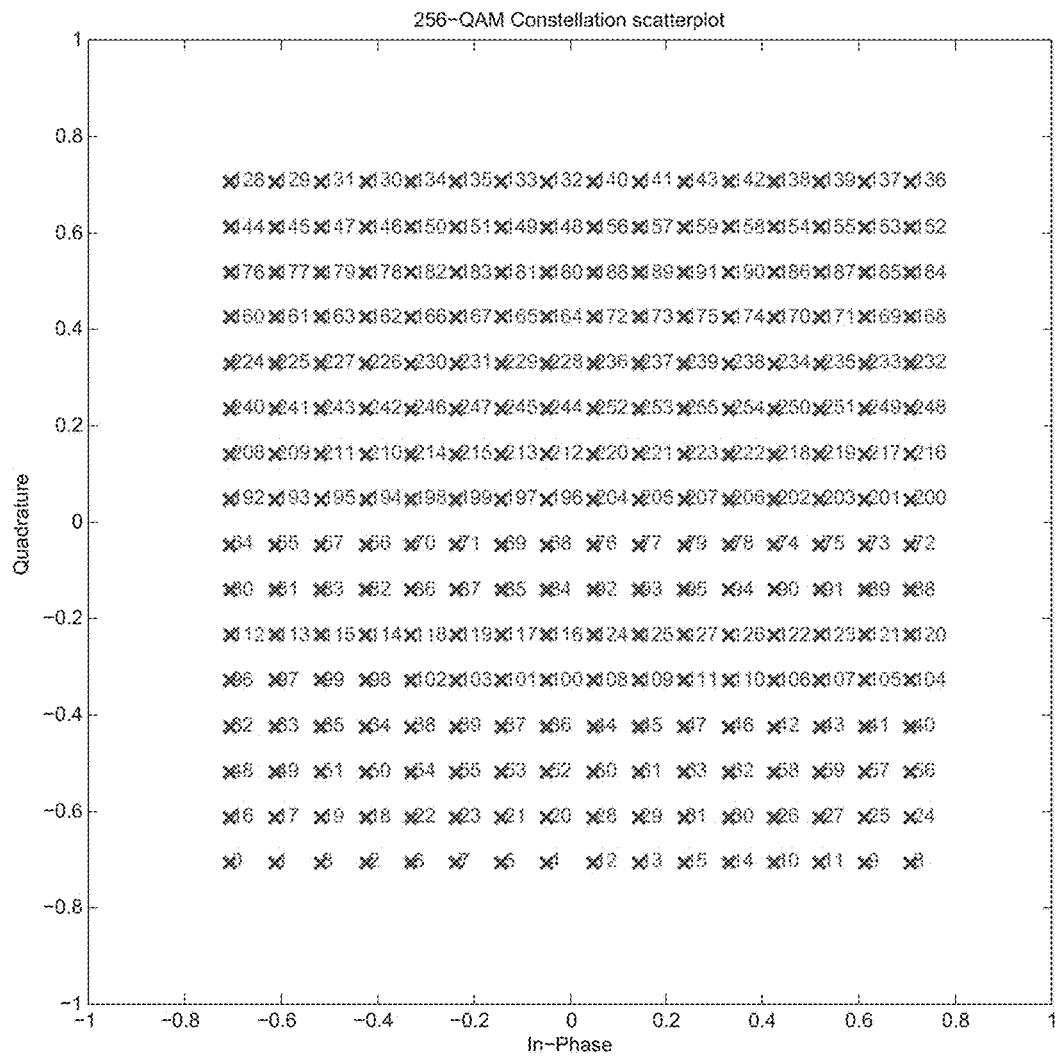
Figure 6:
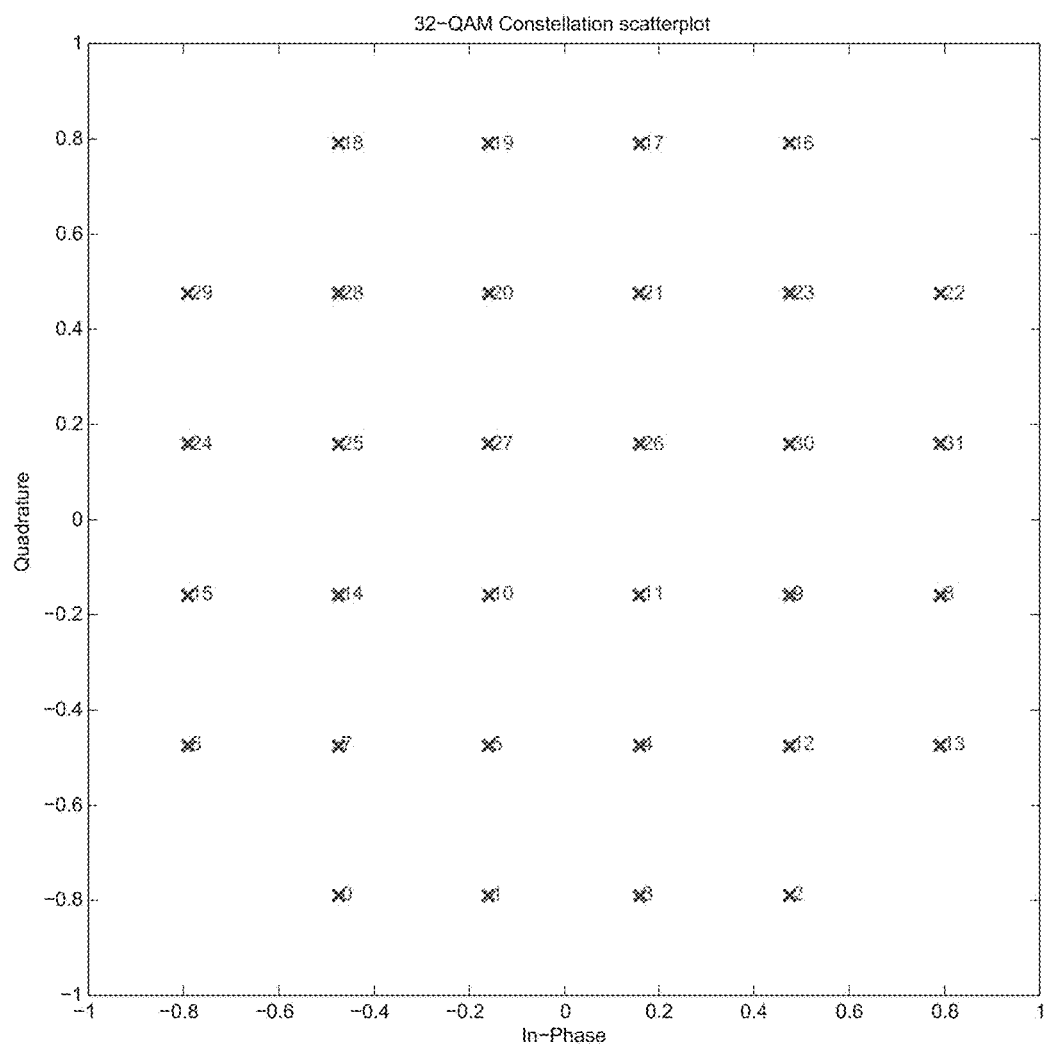
Figure 7:
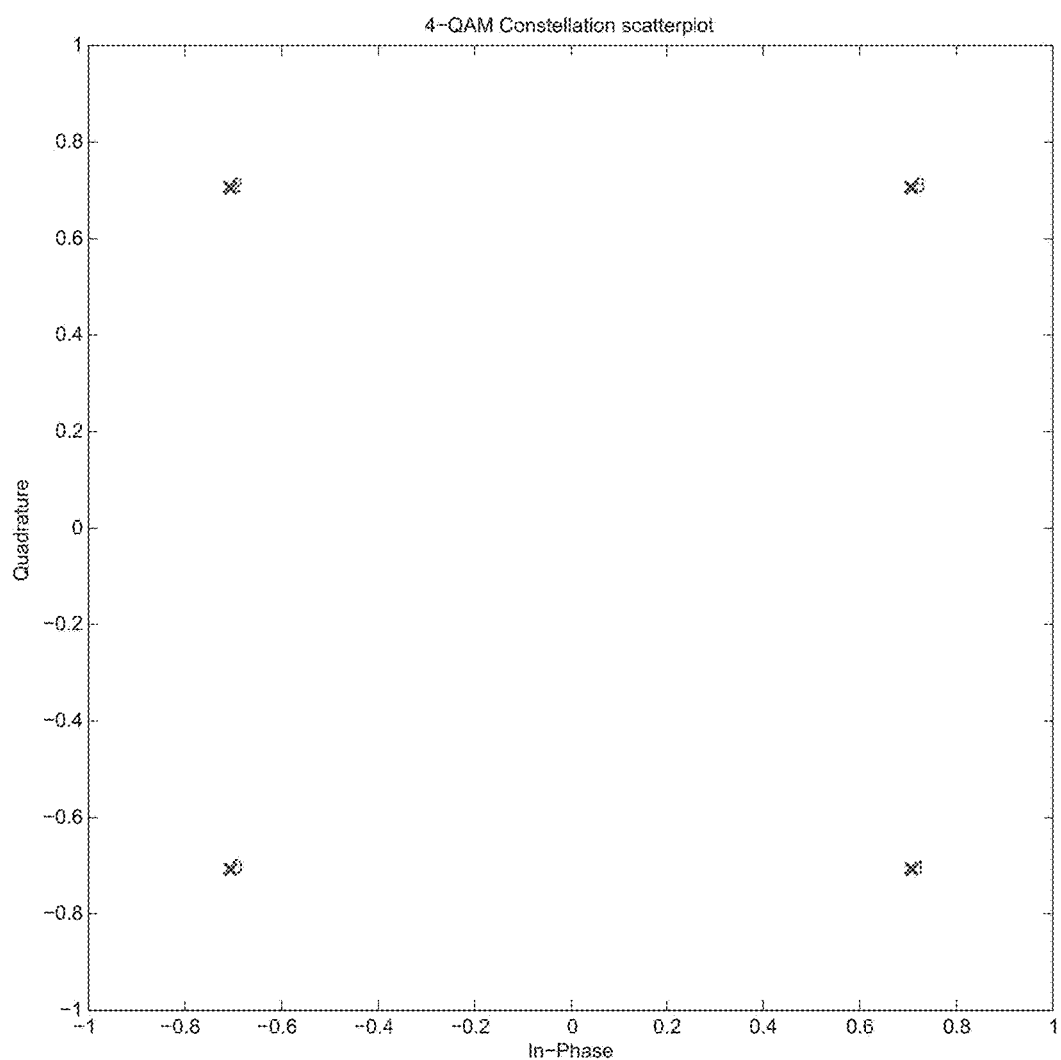
Figure 8:
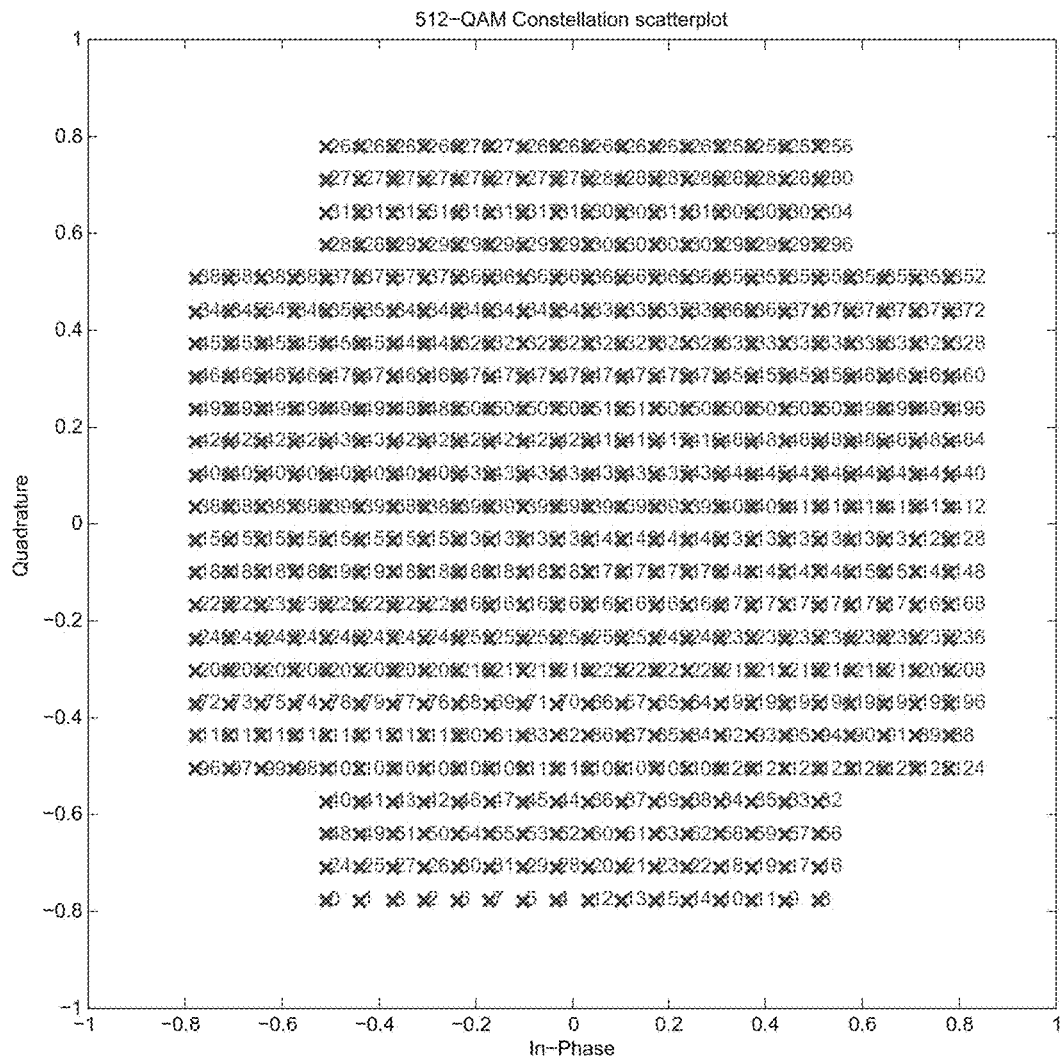
Figure 9:
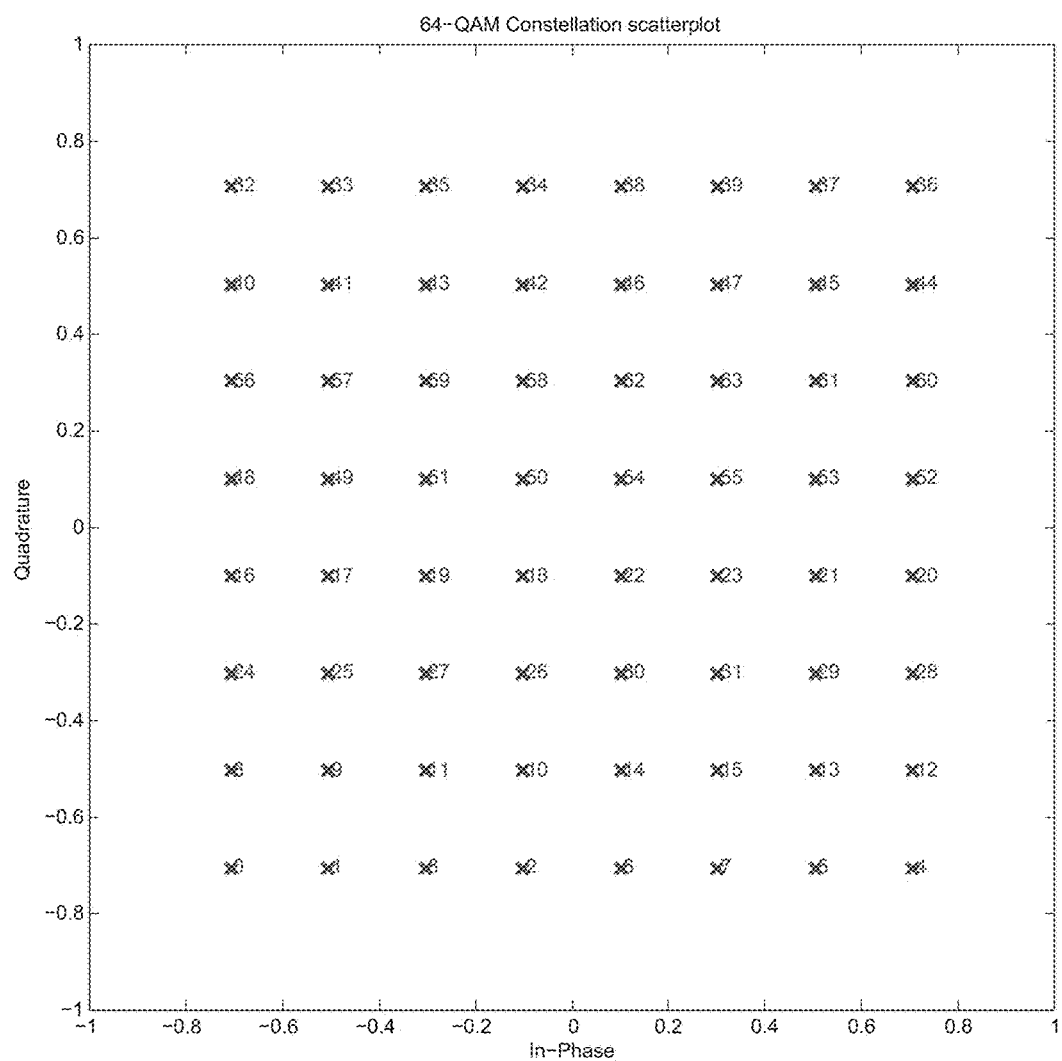
Figure 10:
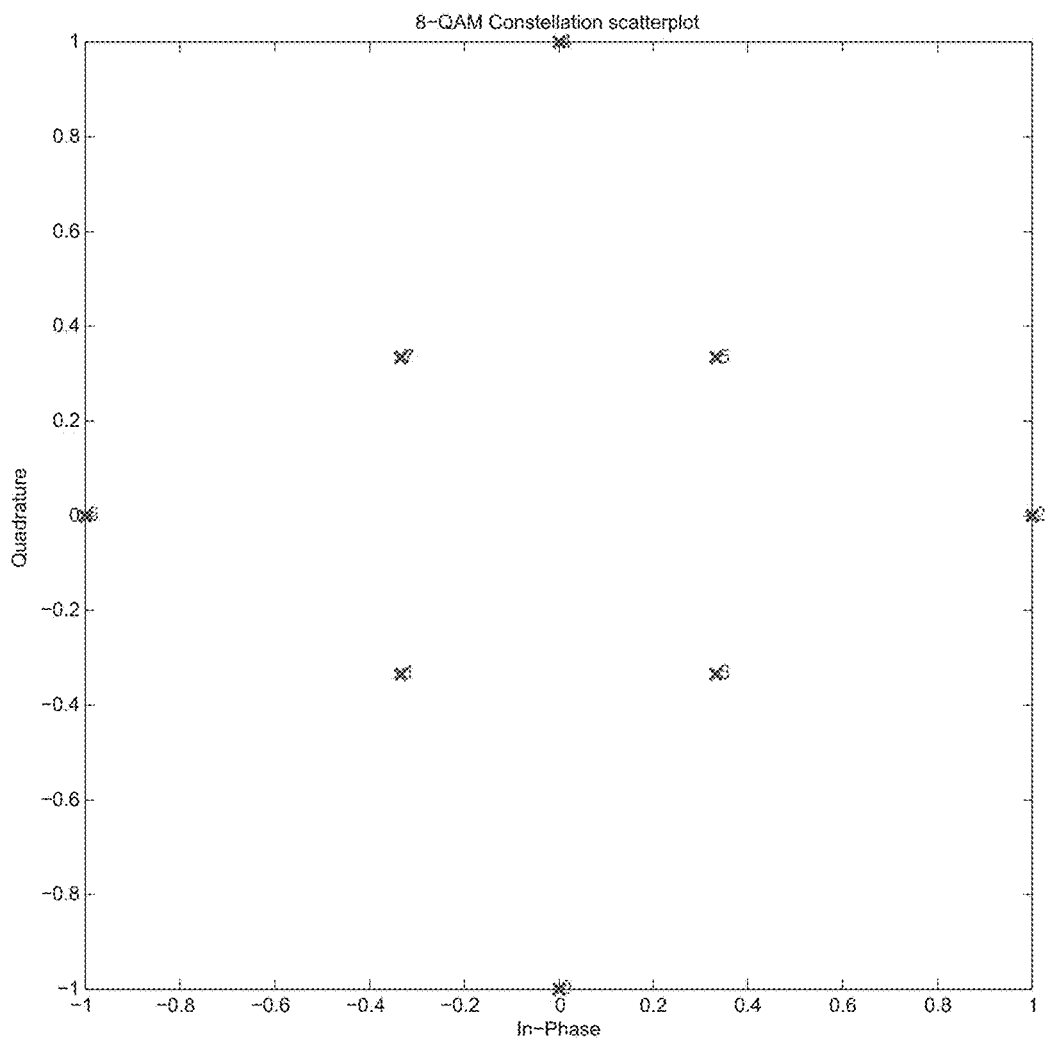

This invention relates to data communications over noisy media (communications channels) with frequency-dependent attenuation. The received signal may be impaired by both noise and attenuation, which can vary over both time and frequency. For example, the noisy media communications environment may include a powerline communications system that operates across a 200 km subsea cable or umbilical with a useable frequency band below 10 to 20 kHz. Alternatively, for shorter distances, such as 10 to 20 km, the useable frequency band may be up to 500 kHz to 800 kHz. The ability of a powerline modem to account for and adjust to extreme noise levels, significant signal attenuation due to cable distance and characteristics, and diminished communications capability and changing communications performance, due, for example, to electrical devices connected to the powerline, may depend on an ability of a modem or the modems comprising the powerline communications system to select a modulation scheme best-suited to the network environment. For example, a modem may monitor channel performance and switch between various forms of QAM modulation of increasing complexity and increasing number of bits per symbol and consequently increasing numbers of symbols, such as BPSK progressing to QPSK progressing to 64 symbols per symbol set with 6 bits per symbol, namely, 2^6 symbols which is 64-QAM or 256 symbols per symbol set with 8 bits per symbol, namely, 2^8 symbols which is 256-QAM (FIG. 10), or other M-ary modulation schemes A desirable feature of a data communications system is to maximize the data throughput. Complex modulation with multiple bits per symbol, such as quadrature amplitude modulation (QAM), can be used to increase the throughput. The particular bit sequence determines which symbol from a set of symbols is transmitted. The receiver needs to determine which symbol from the set of symbols was transmitted. The set of symbols forms a constellation diagram. Under ideal conditions, the demodulator determines the point on the constellation diagram where the received symbol corresponds to the transmitted symbol. However, due to noise and frequency-dependent attenuation on the channel, the received symbol would be located at a distance from any transmitted symbol point on the constellation diagram. For each received symbol, the demodulator computes the distance between the received symbol and the surrounding symbols. The constellation symbols are sorted by their distance to the received symbol. The constellation is arranged using gray coding such that two constellation points that are next to each other will have one bit difference. In some configurations of constellations, there may be more than one bit difference. The XOR of the two closest constellation symbol points to the received symbol point gives the weakest bit position or positions of the received symbol to be potentially designated an erasure position or erasure positions for a decoding engine, such as a forward error correction (FEC) decoding engine implementing soft error correction. The two closest constellation points to the received symbol point are logically combined using an XOR operation. Note that using a gray code may result in more than one bit difference. A weight may be assigned to those bits with the weakest bit position. Identifying one or more bits as having the most uncertainty based on the distance from where the received symbol point is located relative to the nearest two constellation points of the transmitted constellation diagram may be used as information to an error correcting engine to correct data payloads that have one or more errors. In one configuration, an extended binary Golay code, G24 is used to encode 12 bits of data in a 24-bit word. Using this Golay code, a receiving system may use FEC using a soft error correction engine to correct in a 24-bit code word (1) 3 hard errors, and 1 soft error, (2) 2 hard errors and 3 soft errors, (3) 1 hard error and 5 soft errors, or (4) 0 hard errors and 7 soft errors, The 24-bit Golay code words are constructed based upon concatenation of multiple symbols. The N-most uncertain points in any received Golay code word formed by a concatenation of received symbols can then be identified in order to provide error correction using the Golay code.

More precisely, a weight to the uncertainty about the bit or bits to erase, i.e., this weakest bit position or positions of the symbol, can also be assigned. The Euclidean distance on the 2-dimensional constellation diagram between the calculated location of the received symbol and any known transmitted symbol can be calculated. The ratio of the two distances to the two closest constellation points, that is, the distance between the received symbol and the closest constellation symbol/the distance between the received symbol and the next closest constellation symbol may be used to represent the relative uncertainty for the bit position or positions of the symbol which is designated as the potential erasure position or positions. The most uncertain is 1 (equidistant), the least uncertain is 0 (the received symbol corresponds to a constellation symbol). The weight of a bit position or positions to be potentially erased may be set to represent smallest distance (or next smallest distance) such that is represented as value that is less than or equal to 1. This ratio scales the uncertainty so the erasure bit positions can be ranked over a number of received symbols. This approach effectively determines which bit position or positions of each symbol could be an erasure position or positions and assigns a weight to this erasure position or positions.

A frequency domain equalizer can be constructed from a received signal and knowledge of the transmitted signal. For those a priori known portions of the frequency band or spectrum of the transmitted signal that contain a small amount of power relative to other portions of the frequency band of the transmitted signal, zeroing these lowest power frequency points of the constructed frequency domain digital equalizer improves the performance of the equalizer. This may often be a higher part of the frequency band above the first one or few lobes of the transmitted signal spectrum.

A channel transfer function and in turn a frequency domain equalizer can be constructed using a known transmitted preamble and the received preamble at the beginning of a data frame or packet, which allow the receiver to correct for channel impairments. Even using an equalizer, the receiver needs to make a determination as to the suitability of a specified QAM scheme for a designated channel in a single channel or multichannel transmission system, for example, after determining the extent to which the equalizer can correct for channel impairments. Depending on the channel impairments, the transmitting system may be configured to alter the complexity of the symbol set (e.g., by going to 64-QAM from 256-QAM).

Further, if performance on a given frequency band drops below a threshold degree of performance, the transmitting system may be configured to a different symbol set over the whole band or in that frequency band, or even to avoid using that frequency band in future communications. For example, the receiver may be monitoring the extent to which retransmissions are required and/or the extent to which FEC components have to make corrections. Exceeding a threshold amount of retransmissions and/or performing a threshold amount of error correction may be indicative of changes in the channel transfer function that was previously developed and/or established.

The calculated filter coefficients of the frequency domain equalizer can often be corrupted from the optimal values due to noise, signal attenuation or the long impulse response of the channel. In the frequency domain, these filter coefficients can be further altered or modified, for example by being smoothed and the channel long impulse response truncated by means of a filter such as an FIR filter or IIR filter, to improve the communications performance.

To obtain the best communications performance, it is necessary to choose the optimal channel loading, namely which modulation symbol set should be used, as in M-ary modulation, for example, in QAM modulation, which QAM modulation should be used. To optimize throughput, a modulation scheme is chosen with the largest number of bits per symbol providing an acceptable error rate. Also, due to the dynamic range of any receiver and the better performance of the receiver if the received signal is within its dynamic range or a particular amplitude region, it is often beneficial to adjust the receiver gain and even the transmitter gain.

Forward error correcting codes are typically applied to the transmitted data to achieve a particular bit error rate. The forward error correction (FEC) is typically chosen to guarantee an error rate that can handle possible worst-case channel conditions. However, in dynamic channels, there will be times when the correcting bounds of the FEC are exceeded. The data can be transmitted in frames imposed of blocks incorporating both forward error correction and error detection, which can be acknowledged by the receiver using an error-detecting code to determine which blocks were not corrected by the FEC. This allows for a low level link protocol that can achieve a lower bit error rate through retransmission by the transmitter of any blocks that were unable to be corrected by the FEC, as determined by acknowledgements received from the receiver. Across a wideband, multi-channel (namely, multiple subchannels), multi-frequency transmission system, a modem may be configured to transmit information on those channels using modulation for each of the subchannels suitable for the level of signal impairment in each of the subchannels. Optimal QAM schemes can be coordinated so the transmitter and/or receiver can process information for the transmitter to determine what QAM modulation to use.

In such acknowledged communications, the receiver acknowledges which blocks of a transmitted frame or packet are correctly received sending acknowledgements known as ACKs or NAKs to the transmitter. From the information on the number of blocks correctly received or the bit error rate or any other measure of receiver performance in the received acknowledgment, the transmitter can adaptively set transmitter gain or determine the optimal modulation symbol set, for example, by using the number of block errors reported by the receiver in an ACK or a NAK as a measure to determine the most suitable modulation.

In one configuration, the acknowledgement message is configured instruct the transmitter which QAM scheme to use on a specified channel in a multiband transmission system. In another configuration, the acknowledgement message may indicate bit error rate for a sequence of transmissions or the extent number of data blocks or frames or packets that were received without error.

The receiver may also need to set the gain of the receiver or determine which communications paths or channels to use. As with the transmitter the receiver gain or path used can be adaptively determined by the number or rate of bit, code word or block errors contained in a received frame or packet.

The error rate may vary with the load, the performance and noise characteristics of connected equipment, the temperature, and/or other criteria that change the transmission characteristics. For example, some of the channels may be using 64-QAM (6 bits/symbol) scheme in an industrial factory prior to activating a particular piece of equipment. Activating a particular piece of equipment, e.g., a variable frequency drive (VFD), may result in result in signal degradation to the extent that only 4-bits/symbols can be supported at a desired performance level or using designated frequencies. For example, the variable frequency drive motor may be intermittently active and impose greater noise conditions when active. The modems may switch from 64-QAM to 16-QAM in response to detecting activation of the VFD drive.

The context of noisy media and the applicability of one or more QAM schemes may vary between different application environments. For example, a 200 km subsea cable may operate below 10 to 20 kHz in a 64-QAM scheme. In contrast, a shorter length mining cable may be configured to operate below 500 kHz using a 256 QAM scheme. Still, an industrial manufacturing facility may operate below 700, 800, or 900 kHz. In all these environments, both frequency-dependent attenuation and noise due to connected devices, such as motors and power supplies create a noisy media environment necessitating the system described above.

Figure 11:
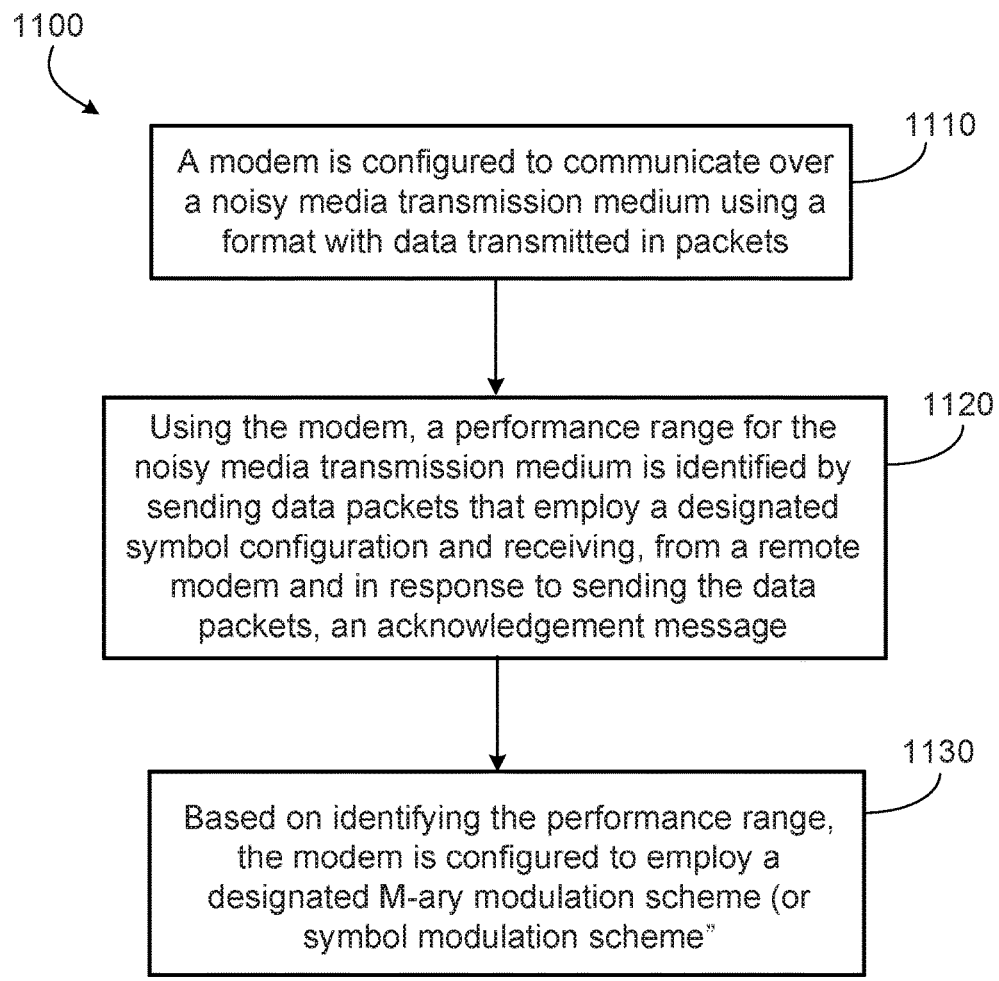
FIGS. 11 and 12 are flow charts of a process by which noisy media communications may be exchanged.
Figure 12:
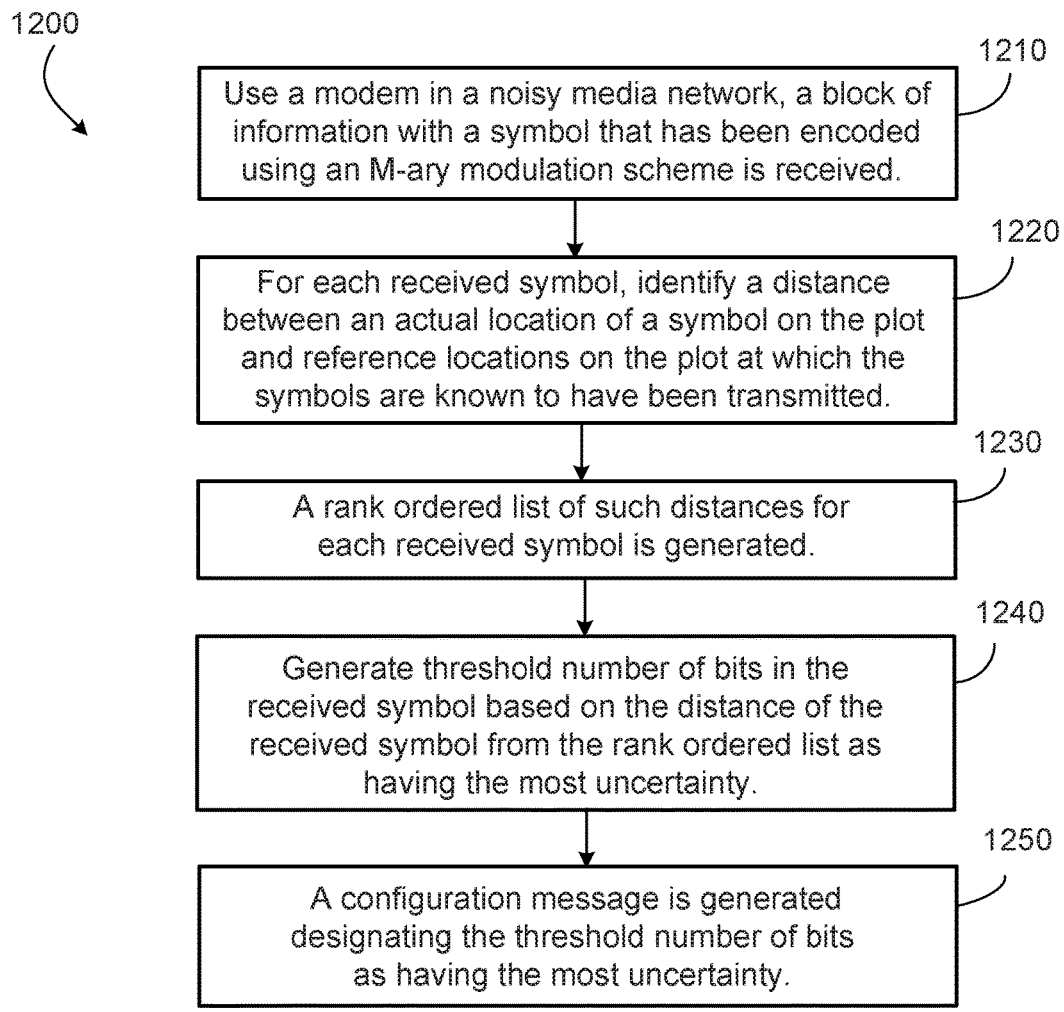

FIGS. 1-10 represent symbol representation based on the in-phase value and the quadrature value. FIGS. 11 and 12 are flow charts of a process by which noisy media communications may be exchanged. In FIG. 11, flow chart 1100 illustrates a method of enabling communications across a noisy media environment. For example, a collection of modems may be configured to exchange control information across a subterranean mine with cables that permeate power equipment distributed throughout the mine. Initially, a modem is configured to communicate over a noisy media transmission medium using a format with data transmitted in packets (1110). The modem may be configured to connect to a power circuit and exchange communications across a specified portion of the spectrum on the power line. In one configuration, the modem dynamically discovers the frequency characteristics of the power line and then coordinates with other modems to use the frequencies best suited to achieve desired data rates while also achieving better performance in a noisy media environment.

Using the modem, a performance range for the noisy media transmission medium is identified by sending data packets that employ a designated symbol configuration and receiving, from a remote modem and in response to sending the data packets, an acknowledgement message (1120). For example, a transmitting modem may be configured to test a power line by sending a sequence of symbols at different frequencies and measure the performance of the power line in supporting a particular frequency range (as described above). A receiving modem may respond with an acknowledgement message (e.g., an ACK message) that describes the performance characteristics of the power line as measured by the receiver (e.g., a specified BER). Negative acknowledgement messages also may be used as acknowledgement messages. For example, receiving the acknowledgement message may include receiving a negative acknowledgement message indicating that the designated symbol configuration should not be used. In one configuration, receiving the acknowledgement message includes receiving an acknowledgement message indicating that the designated symbol configuration should be used. For example, the receiving modem may make a determination that QAM 256 should be used as a result of evaluating messages sent by the transmitting system. Alternatively or in addition, receiving the acknowledgement message may include receiving an acknowledgement message indicating that the designated symbol configuration is supported. The transmitted then may consider the application environment and select a symbol scheme based on consideration of both the supported symbols and the application requirements. Receiving the acknowledgement message also may include receiving an acknowledgement message for a sequence of multiple packets indicating an extent to which the sequence of multiple packets support the designated symbol configuration.

Identifying the performance range may include using multiple symbol configurations, and identifying which of the multiple symbol configurations can be supported with a threshold degree of performance (e.g., BER, number of corrections, threshold number of retransmissions).

Based on identifying the performance range, the modem is configured to employ a designated M-ary modulation scheme (or symbol modulation scheme) (1130). Configuring the modem to employ the designated QAM modulation scheme based on the performance range may include specifying the designated QAM modulation scheme in a header of a packet. This allows a receiver to process the information received in the payload by routing the received information to the appropriate logic in generating the logical symbol constellation map. Specifying the designated QAM modulation scheme may include specifying the designated QAM modulation scheme in packet. Alternatively or in addition, the transmitter may be configured to not transmit on impaired frequencies.

FIG. 12 is a flow chart 1200 for a method of generating a configuration message for a Forward Error Correction processor. For example, flow chart 1200 may be used on a digital signal processor (DSP) that is used to process a signal received from a modem on a subsea cable. The configuration message may be used to perform additional processing on a received message so that messages with less than a threshold degree of errors may be recovered.

Initially, using a modem in a noisy media network, a block of information with a symbol that has been encoded using an M-ary modulation scheme is received (1210). For example, a message using a QAM 256 may be received. For each received symbol, identifying a distance between an actual location of a symbol on the plot and reference locations on the plot at which the symbols are known to have been transmitted (1220). This may be done by calculating a gray code. As described above, a rank ordered list of such distances for each received symbol is generated (1230).

A threshold number of bits in the received symbol based on the distance of the received symbol from the rank ordered list as having the most uncertainty (1240). Finally, a configuration message is generated designating the threshold number of bits as having the most uncertainty (1250). For example, a DSP may configure error correction logic to treat designated bits as representing the most likely uncertainty and perform error correction based on the designated uncertainty.

Figure 13:
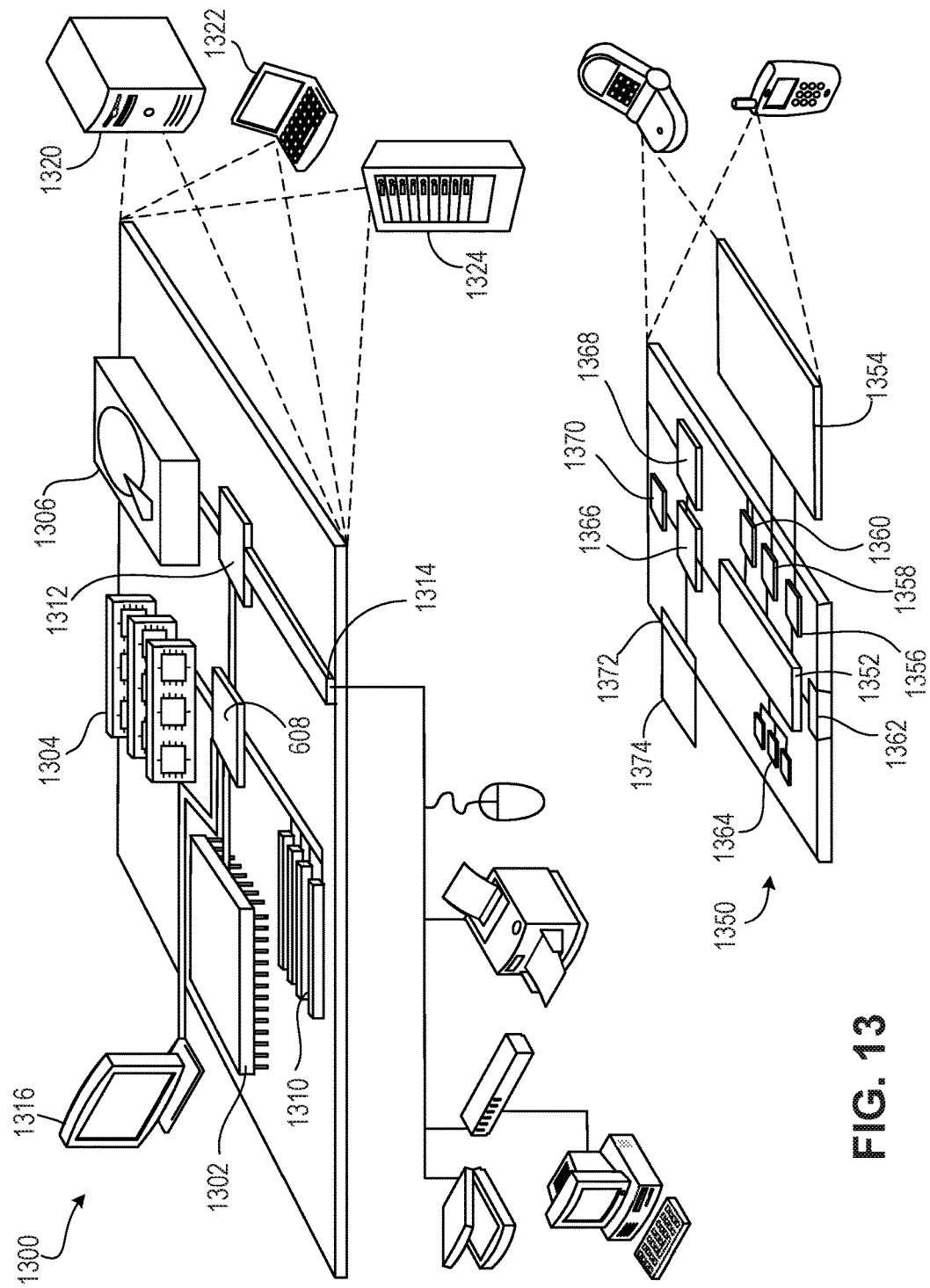
FIG. 13 is a diagram of two communications devices configured to exchange communications over a network.

FIG. 13 is a block diagram of computing devices 1300, 1350 that may be used to implement the systems and methods described in this document, as either a client or as a server or plurality of servers. Generally, a variety of communications and/or computing gear may be configured to interface with different remote systems in a noisy media environment. In some configurations, the devices described herein may be coupled to noisy media environments and used in a variety of contexts from industrial control equipment (e.g., deep sea drilling gear, mining controllers). In those configurations, there may be limited computing resources on remote systems and the remote station may be configured to support minimal control systems in austere environments. In other configurations, computing systems may be configured to interface with one another across these noisy media environments. FIG. 13 is configured to illustrate those environments where computing devices are configured to interface across the noisy media network. Generally, computing device 1300 is intended to represent various forms of digital computers. Computing device 1350 is intended to represent various remote systems and/or controllers.

Computing device 1300 may include a processor 1302, memory 1304, a storage device 1306, a high-speed interface 608 connecting to memory 1304 and high-speed expansion ports 1310, and a low speed interface 1312 connecting to low speed bus 1314 and storage device 1306. Each of the components 1302, 1304, 1306, 608, 1310, and 1312, are interconnected using various busses, and may be mounted on a common motherboard or in other manners as appropriate. The processor 1302 can process instructions for execution within the computing device 1300, including instructions stored in the memory 1304 or on the storage device 1306 to display graphical information for a GUI on an external input/output device, such as display 1316 co-hyperlinked to high speed interface 1308. In other implementations, multiple processors and/or multiple buses may be used, as appropriate, along with multiple memories and types of memory. Also, multiple computing devices 1300 may be connected, with each device providing portions of the necessary operations (e.g., as a server bank, a group of blade servers, or a multi-processor system).

The memory 1304 stores information within the computing device 1300. In one implementation, the memory 1304 is a volatile memory unit or units. In another implementation, the memory 1304 is a non-volatile memory unit or units. The memory 1304 may also be another form of computer-readable medium, such as a magnetic or optical disk.

The storage device 1306 is capable of providing mass storage for the computing device 1300. In one implementation, the storage device 1306 may be or contain a computer-readable medium, such as a floppy disk device, a hard disk device, an optical disk device, or a tape device, a flash memory or other similar solid state memory device, or an array of devices, including devices in a storage area network or other configurations. A computer program product can be tangibly embodied in an information carrier. The computer program product may also contain instructions that, when executed, perform one or more methods, such as those described above. The information carrier is a computer- or machine-readable medium, such as the memory 1304, the storage device 1306, or memory on processor 1302.

The high speed controller 1308 manages bandwidth-intensive operations for the computing device 1300, while the low speed controller 1312 manages lower bandwidth intensive operations. Such allocation of functions is exemplary only. In one implementation, the high-speed controller 1308 is co-hyperlinked to memory 1304, display 1316 (e.g., through a graphics processor or accelerator), and to high-speed expansion ports 1310, which may accept various expansion cards (not shown). In the implementation, low-speed controller 1312 is co-hyperlinked to storage device 1306 and low-speed expansion port. The low-speed expansion port, which may include various communication ports (e.g., USB, Bluetooth, Ethernet, wireless Ethernet) may be co-hyperlinked to one or more input/output devices, such as a keyboard, a pointing device, microphone/speaker pair, a scanner, or a networking device such as a switch or router, e.g., through a network adapter. The computing device 1300 may be implemented in a number of different forms, as shown in the figure. For example, it may be implemented as a standard server 1320, or multiple times in a group of such servers. It may also be implemented as part of a rack server system 1324. In addition, it may be implemented in a personal computer such as a laptop computer 1322 or an industrial controller (not shown). Alternatively, components from computing device 1300 may be combined with other components in a mobile device (not shown), such as device 1350. Each of such devices may contain one or more of computing device 1300, 1350, and an entire system may be made up of multiple computing devices 1300, 1350 communicating with each other.

The computing device 1300 may be implemented in a number of different forms, as shown in the figure. For example, it may be implemented as an industrial server 1320. It may also be implemented as part of a rack server system 1324. In addition, it may be implemented in a personal computer such as a laptop computer 1322. Alternatively, components from computing device 1300 may be combined with other components in a mobile device (not shown), such as device 1350. Each of such devices may contain one or more of computing device 1300, 1350, and an entire system may be made up of multiple computing devices 1300, 1350 communicating with each other.

Computing device 1350 may include a processor 1352, memory 1364, and an input/output device such as a display 1354, a communication interface 1366, and a transceiver 1368, among other components. The device 1350 may also be provided with a storage device, such as a microdrive or other device, to provide additional storage. Each of the components 1350, 1352, 1364, 1354, 1366, and 1368, are interconnected using various buses, and several of the components may be mounted on a common motherboard or in other manners as appropriate.

The processor 1352 can execute instructions within the computing device 1350, including instructions stored in the memory 1364. The processor may be implemented as a chipset of chips that include separate and multiple analog and digital processors. Additionally, the processor may be implemented using any of a number of architectures. For example, the processor 1310 may be a CISC (Complex Instruction Set Computers) processor, a RISC (Reduced Instruction Set Computer) processor, or a MISC (Minimal Instruction Set Computer) processor. The processor may provide, for example, for coordination of the other components of the device 1350, such as control of user interfaces, applications run by device 1350, and wireless communication by device 1350.

Processor 1352 may communicate with a user through control interface 1358 and display interface 1356 co-hyperlinked to a display 1354. The display interface 1356 may comprise appropriate circuitry for driving the display 1354 to present graphical and other information to a user, such as controlling industrial equipment that is local and/or remote. The control interface 1358 may receive commands from a user and convert them for submission to the processor 1352. In addition, an external interface 1362 may be provide in communication with processor 1352, so as to enable near area communication of device 1350 with other devices. External interface 1362 may provide, for example, for wired communication in some implementations, or for wireless communication in other implementations, and multiple interfaces may also be used.

The memory 1364 stores information within the computing device 1350. The memory 1364 can be implemented as one or more of a computer-readable medium or media, a volatile memory unit or units, or a non-volatile memory unit or units. Expansion memory 1374 may also be provided and connected to device 1350 through expansion interface 1372, which may include, for example, a SIMM (Single In Line Memory Module) card interface. Such expansion memory 1374 may provide extra storage space for device 1350, or may also store applications or other information for device 1350. Specifically, expansion memory 1374 may include instructions to carry out or supplement the processes described above, and may include secure information also. Thus, for example, expansion memory 1374 may be provide as a security module for device 1350, and may be programmed with instructions that permit secure use of device 1350. In addition, secure applications may be provided via the SIMM cards, along with additional information, such as placing identifying information on the SIMM card in a non-hackable manner.

The memory may include, for example, flash memory and/or NVRAM memory, as discussed below. In one implementation, a computer program product is tangibly embodied in an information carrier. The computer program product contains instructions that, when executed, perform one or more methods, such as those described above. The information carrier is a computer- or machine-readable medium, such as the memory 1364, expansion memory 1374, or memory on processor 1352 that may be received, for example, over transceiver 1368 or external interface 1362.

Device 1350 may communicate remotely through communication interface 1366, which may include digital signal processing circuitry where necessary. Communication interface 1366 may provide for communications under various modes or protocols, such as powerline networks, wireless networks, other noisy media networks, among others. Such communication may occur, for example, through radio-frequency transceiver 1368, which can be coupled to a noisy medium. In addition, an inertial navigation system module 1370 may provide additional navigation- and location-related wireless data to device 1350, which may be used as appropriate by applications running on device 1350. Device 1350 may also communicate audibly using audio codec 1360, which may receive spoken information from a user and convert it to usable digital information. Audio codec 1360 may likewise generate audible sound for a user, such as through a speaker, e.g., in a handset of device 1350. Such sound may include sound from voice telephone calls, may include recorded sound and may also include sound generated by applications operating on device 1350.

The computing device 1350 may be implemented in a number of different forms, as shown in the figure.

Various implementations of the systems and methods described here can be realized in digital electronic circuitry, integrated circuitry, specially designed ASICs (application specific integrated circuits), computer hardware, firmware, software, and/or combinations of such implementations. These various implementations can include implementation in one or more computer programs that are executable and/or interpretable on a programmable system including at least one programmable processor, which may be special or general purpose, co-hyperlinked to receive data and instructions from, and to transmit data and instructions to, a storage system, at least one input device, and at least one output device. These computer programs (also known as programs, software, software applications or code) include machine instructions for a programmable processor, and can be implemented in a high-level procedural and/or object-oriented programming language, and/or in assembly/machine language. As used herein, the terms "machine-readable medium" "computer-readable medium" refers to any computer program product, apparatus and/or device (e.g., magnetic discs, optical disks, memory, Programmable Logic Devices (PLDs)) used to provide machine instructions and/or data to a programmable processor, including a machine-readable medium that receives machine instructions as a machine-readable signal. The term "machine-readable signal" refers to any signal used to provide machine instructions and/or data to a programmable processor. To provide for interaction with a user, the systems and techniques described here can be implemented on a computer having a display device (e.g., a CRT (cathode ray tube) or LCD (liquid crystal display) monitor) for displaying information to the user and a keyboard and a pointing device (e.g., a mouse or a trackball) by which the user can provide input to the computer. Other kinds of devices can be used to provide for interaction with a user as well; for example, feedback provided to the user can be any form of sensory feedback (e.g., visual feedback, auditory feedback, or tactile feedback); and input from the user can be received in any form, including acoustic, speech, or tactile input.

The computing system can include clients and servers. A client and server are generally remote from each other and typically interact through a communication network. The relationship of client and server arises by virtue of computer programs running on the respective computers and having a client-server relationship to each other. A number of embodiments have been described. Nevertheless, it will be understood that various modifications may be made without departing from the spirit and scope of the invention. In addition, the logic flows depicted in the figures do not require the particular order shown, or sequential order, to achieve desirable results. In addition, other steps may be provided, or steps may be eliminated, from the described flows, and other components may be added to, or removed from, the described systems. Accordingly, other embodiments are within the scope of the following claims.

What is claimed is:

1. A method of generating a configuration message for a Forward Error Correction processor, the method comprising:
   receiving, using a modem in a noisy media network, a block of information with a symbol that has been encoded using an M-ary modulation scheme;
   for each received symbol, identifying a distance between an actual location of the symbol on the plot and reference locations on the plot at which the symbols are known to have been transmitted;
   generating a rank ordered list of such distances for each received symbol;
   designating a threshold number of bits in the received symbol based on the distance of the received symbol from the rank ordered list as having the most uncertainty; and
   generating a configuration message designating the threshold number of bits as having the most uncertainty.

2. The method of claim 1 further comprising routing the configuration message to a Golay engine to perform forward error correction using the threshold number of bits having the most uncertainty.

3. The method of claim 1, wherein the block of information includes a plurality of symbols.

4. The method of claim 1, wherein the distance of the received symbol from the rank ordered list is a weight assigned to each of one or more bits in each of the received symbols designated as having the most uncertainty, and the Forward Error Correction processor ranks bits in the block of information based on having the most uncertainty into a ranking of most uncertain bits.

5. The method of claim 1, wherein the block of information includes a plurality of symbols and the distance of the received symbol from the rank ordered list is a weight assigned to each of one or more bits in each of the received symbols designated as having the most uncertainty, and the Forward Error Correction processor ranks bits in the block of information based on having the most uncertainty into a ranking of most uncertain bits.

6. The method of claim 1, wherein the Forward Error Correction processor performs soft error correction on the block of information based on the ranking of the most uncertain bits in the block of information.

7. The method of claim 6, wherein, based on the ranking of the most uncertain bits, the soft error correction uses erasures for a portion of the most uncertain bits in the block of information.

8. The method of claim 1, wherein the distance of the received symbol from the rank ordered list is a weight determined from a ratio of the distances between the actual location of the symbol on the plot and closest reference locations on the plot at which the symbols are known to have been transmitted.

9. The method of claim 1, wherein the bits having the most uncertainty in a received symbol are determined from the rank ordered list by the bit positions determined by a difference in bits of the symbols at the closest reference locations on the plot at which the symbols are known to have been transmitted.

10. The method of claim 9, wherein a difference in bits of the symbols at the closest reference locations on the plot at which the symbols are known to have been transmitted is determined by an XOR of the symbols at the closest reference locations.

11. The method of claim 1, wherein the reference locations on the plot at which the symbols are known to have been transmitted are arranged using gray coding.

12. The method of claim 1, wherein the noisy media network is a subsea cable.

13. The method of claim 1, wherein the noisy media network is a power line.

14. The method of claim 1, wherein the M-ary modulation scheme is QAM.

15. A system for generating a configuration message for a Forward Error Correction processor, the system comprising:
- a modem in a noisy media network; and
- the Forward Error Correction processor configured to:
  - receive a block of information with a symbol that has been encoded using an M-ary modulation scheme using the modem in a noisy media network;
  - identify, for each received symbol, a distance between an actual location of the symbol on the plot and reference locations on the plot at which the symbols are known to have been transmitted;
  - generate a rank ordered list of such distances for each received symbol;
  - designate a threshold number of bits in the received symbol based on the distance of the received symbol from the rank ordered list as having the most uncertainty; and
  - generate a configuration message designating the threshold number of bits as having the most uncertainty.

16. The system of claim 15, wherein the Forward Error Correction processor is further configured to route the configuration message to a Golay engine to perform forward error correction using the threshold number of bits having the most uncertainty.

17. The system of claim 15, wherein the block of information includes a plurality of symbols.

18. The system of claim 15, wherein the distance of the received symbol from the rank ordered list is a weight assigned to each of one or more bits in each of the received symbols designated as having the most uncertainty, and the Forward Error Correction processor ranks bits in the block of information based on having the most uncertainty into a ranking of most uncertain bits.

19. The system of claim 15, wherein the block of information includes a plurality of symbols and the distance of the received symbol from the rank ordered list is a weight assigned to each of one or more bits in each of the received symbols designated as having the most uncertainty, and the Forward Error Correction processor ranks bits in the block of information based on having the most uncertainty into a ranking of most uncertain bits.

20. The system of claim 15, wherein the Forward Error Correction processor performs soft error correction on the block of information based on the ranking of the most uncertain bits in the block of information.

21. The system of claim 20, wherein, based on the ranking of the most uncertain bits, the soft error correction uses erasures for a portion of the most uncertain bits in the block of information.

22. The system of claim 15, wherein the distance of the received symbol from the rank ordered list is a weight determined from a ratio of the distances between the actual location of the symbol on the plot and closest reference locations on the plot at which the symbols are known to have been transmitted.

23. The system of claim 15, wherein the bits having the most uncertainty in a received symbol are determined from the rank ordered list by the bit positions determined by a difference in bits of the symbols at the closest reference locations on the plot at which the symbols are known to have been transmitted.

24. The system of claim 23, wherein a difference in bits of the symbols at the closest reference locations on the plot at which the symbols are known to have been transmitted is determined by an XOR of the symbols at the closest reference locations.

25. The system of claim 15, wherein the reference locations on the plot at which the symbols are known to have been transmitted are arranged using gray coding.

26. The system of claim 15, wherein the noisy media network is a subsea cable.

27. The system of claim 15, wherein the noisy media network is a power line.

28. The system of claim 15, wherein the M-ary modulation scheme is QAM.

* * * * *